(12) United States Patent
Choi et al.

(10) Patent No.: US 10,608,202 B2
(45) Date of Patent: Mar. 31, 2020

(54) DISPLAY APPARATUS WITH BENT AREA INCLUDING SPACED PATTERNS

(71) Applicant: SAMSUNG DISPLAY CO., LTD., Yongin-si, Gyeonggi-do (KR)

(72) Inventors: Jinhwan Choi, Yongin-si (KR); Taehoon Yang, Yongin-si (KR); Boik Park, Yongin-si (KR); Taean Seo, Yongin-si (KR); Kiyong Lee, Yongin-si (KR)

(73) Assignee: SAMSUNG DISPLAY CO., LTD., Yong-si, Gyeonggi-Do (KR)

( * ) Notice: Subject to any disclaimer, the term of this patent is extended or adjusted under 35 U.S.C. 154(b) by 0 days.

(21) Appl. No.: 15/591,563

(22) Filed: May 10, 2017

(65) Prior Publication Data

US 2017/0331073 A1 Nov. 16, 2017

(30) Foreign Application Priority Data

May 11, 2016 (KR) .......................... 10-2016-0057811

(51) Int. Cl.
*H01L 51/52* (2006.01)
*H01L 27/32* (2006.01)
*H01L 51/00* (2006.01)

(52) U.S. Cl.
CPC ...... *H01L 51/5256* (2013.01); *H01L 27/3244* (2013.01); *H01L 27/3248* (2013.01); *H01L 27/3258* (2013.01); *H01L 27/3262* (2013.01); *H01L 51/0096* (2013.01); *H01L 51/5246* (2013.01); *H01L 51/5253* (2013.01); *Y02E 10/549* (2013.01)

(58) Field of Classification Search
CPC ............. H01L 51/5256; H01L 27/3258; H01L 27/3244
USPC ........................................... 257/40, E27.119
See application file for complete search history.

(56) References Cited

U.S. PATENT DOCUMENTS

| | | |
|---|---|---|
| 9,123,911 B2 | 9/2015 | Kim et al. |
| 2013/0248826 A1* | 9/2013 | Kim ..................... H05K 1/0281 257/40 |
| 2014/0361263 A1 | 12/2014 | Kim |

(Continued)

FOREIGN PATENT DOCUMENTS

| | | |
|---|---|---|
| KR | 10-2014-0127633 A | 11/2014 |
| KR | 10-2014-0143635 A | 12/2014 |

(Continued)

*Primary Examiner* — Robert T Huber
(74) *Attorney, Agent, or Firm* — Kile Park Reed & Houtteman PLLC

(57) ABSTRACT

A display apparatus includes a substrate having a first area, a second area, and a third area, the second area being between the first and third areas, a display unit on the substrate in the first area, and an encapsulation layer covering the display unit in the first area and extending into the second area, the encapsulation layer including a first inorganic layer, a second inorganic layer, an organic layer between the first and second inorganic layers in the first area, and a plurality of organic patterns spaced apart from each other at certain intervals in the second area. The first and third areas of the substrate are bent with respect to each other at a predetermined angle, other than a straight angle, with the second area bent therebetween, and the plurality of organic patterns are in the second area that is bent toward the bottom of the substrate.

19 Claims, 8 Drawing Sheets

(56) References Cited

U.S. PATENT DOCUMENTS

| | | | |
|---|---|---|---|
| 2015/0060786 A1* | 3/2015 | Kwak | H01L 51/5253 257/40 |
| 2015/0116295 A1* | 4/2015 | Pyon | H01L 27/3276 345/211 |
| 2016/0027803 A1 | 1/2016 | Park | |
| 2016/0035812 A1* | 2/2016 | Kwon | H01L 27/3276 257/40 |
| 2016/0111677 A1* | 4/2016 | Hong | H01L 51/5246 257/40 |
| 2016/0226026 A1 | 8/2016 | Kwak | |

FOREIGN PATENT DOCUMENTS

| | | |
|---|---|---|
| KR | 10-2015-0025260 A | 3/2015 |
| KR | 10-2015-0037159 A | 4/2015 |

\* cited by examiner

DISPLAY APPARATUS WITH BENT AREA INCLUDING SPACED PATTERNS

CROSS-REFERENCE TO RELATED APPLICATION

Korean Patent Application No. 10-2016-0057811, filed on May 11, 2016, in the Korean Intellectual Property Office, and entitled: "Display Apparatus," is incorporated by reference herein in its entirety.

BACKGROUND

1. Field

One or more embodiments relate to a display apparatus, and more particularly, to a display apparatus having a long lifetime and reduced manufacturing defects, e.g., cracks.

2. Description of the Related Art

In general, a display apparatus includes a display unit on a substrate. When a portion of the display apparatus is bent, visibility may be improved at various angles, or an area of a non-display area of the display apparatus may decrease.

SUMMARY

According to one or more embodiments, a display apparatus includes a substrate including a first area, a third area, and a second area between the first and third areas, the second area being bent around a bending axis extending in a first direction; a display unit in the first area of the substrate; and an encapsulation layer covering the display unit, being in the first area and the second area, including a first inorganic layer, a second inorganic layer, and an organic layer between the first inorganic layer and the second inorganic layer, and including a plurality of organic patterns that are spaced apart from each other at certain intervals with first spaced regions between the organic patterns in the second area.

The first inorganic layer and the second inorganic layer may directly contact each other in the first spaced regions.

The display unit may include a thin film transistor (TFT), an insulating layer covering the TFT, and an organic light-emitting device (OLED) on the insulating layer, the insulating layer extending from the first area to the second area, and the plurality of organic patterns may be on the insulating layer in the second area.

The first inorganic layer and the second inorganic layer may include a plurality of first trenches in the first spaced regions.

The plurality of first trenches may penetrate the second inorganic layer.

The plurality of first trenches may not completely penetrate the first inorganic layer.

The plurality of first trenches may extend along the bending axis.

The display unit may include: a buffer layer between the substrate and the insulating layer; a first inorganic insulating layer; and a second inorganic insulating layer between the first inorganic insulating layer and the insulating layer, the first inorganic insulating layer and the second inorganic insulating layer extend to the third area from the first area via the second area, and the second inorganic insulating layer may include, in the third area, a plurality of inorganic patterns that are spaced apart from each other with second spaced regions between the plurality of inorganic patterns.

In the second spaced regions, at least a portion of the first inorganic insulating layer may be exposed.

The first inorganic layer and the second inorganic layer may extend to the third area and directly surface-contact each other in the third area.

The first inorganic layer may directly contact the at least a portion of the first inorganic insulating layer in the second spaced regions.

The display apparatus may further include a metal layer covering the plurality of inorganic patterns.

The metal layer may directly contact the at least a portion of the first inorganic insulating layer in the second spaced regions.

The TFT may include a semiconductor layer, a gate electrode, a source electrode, and a drain electrode, the first inorganic insulating layer may be between the semiconductor layer and the gate electrode, and the second inorganic insulating layer may be between the gate electrode and the source electrode or between the gate electrode and the drain electrode.

The metal layer may include a same material as the source electrode or the drain electrode.

The first inorganic insulating layer and the buffer layer in the second spaced regions may include a plurality of second trenches.

The plurality of second trenches may penetrate the first inorganic insulating layer.

The plurality of second trenches may not completely penetrate the buffer layer.

The third area may be a bending area that is bent around the bending axis.

The plurality of second trenches may extend along the bending axis.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
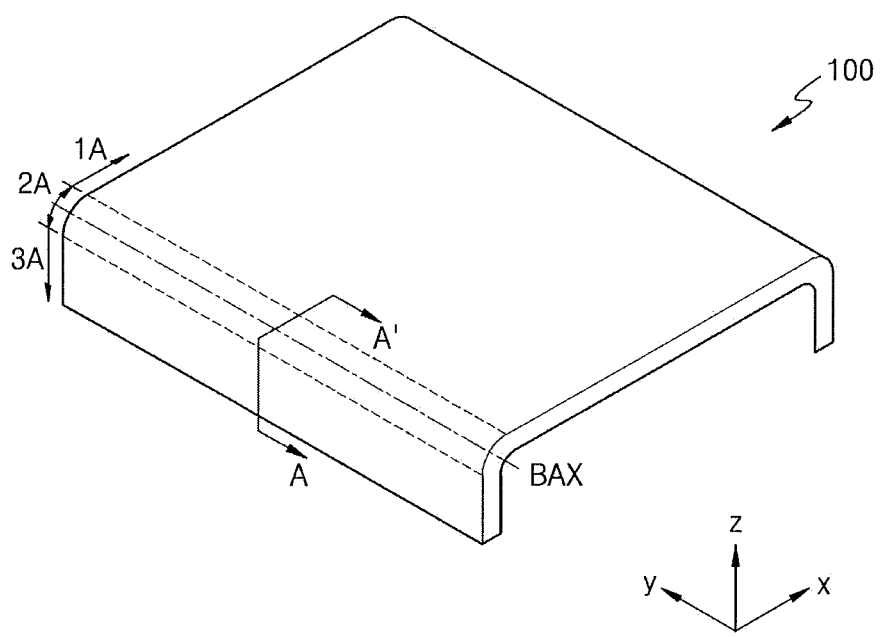
FIG. 1 illustrates a perspective view of a display apparatus according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
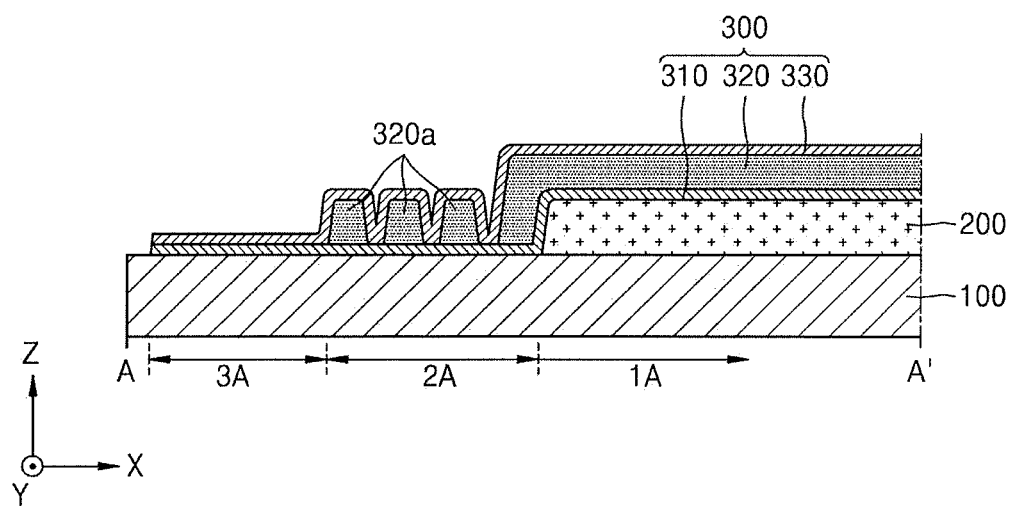
FIG. 2 illustrates a cross-sectional along line A-A' of FIG. 1.

FIG. 1 is a perspective view of a display apparatus according to an embodiment. FIG. 2 is a cross-sectional view taken along line A-A' of the display apparatus of FIG. 1.

Referring to FIGS. 1 and 2, a display apparatus includes a substrate 100, a display unit 200 on the substrate 100, and an encapsulation unit 300 covering the display unit 200. As shown in FIG. 1, a portion of the substrate 100 included in the display apparatus is bent, and thus a portion of the display apparatus is also bent along the bent portion of the substrate 100. However, for convenience, FIG. 2 shows that the display apparatus is not bent. For reference, in cross-sectional views, plan views, and other drawings regarding embodiments to be described, the display apparatus is not bent.

In detail, referring to FIGS. 1-2, the substrate 100 included in the display apparatus according to the present embodiment may include a first area 1A, a third area 3A, and a second area 2A therebetween. In this case, the second area 2A is a bending area, e.g., a portion of the substrate 100 that bends. With respect to the second area 2A, the first area 1A and the third area 3A may be on different planes. That is, with respect to the second area 2A, the first area 1A and the third area 3A may be bent at a preset angle. FIG. 1 shows that the second area 2A and the third area 3A are on one side of the first area 1A, but the second area 2A and the third area 3A may be symmetrically on the other side of the first area 1A. The second area 2A may include a circuit unit including a driving device, etc.

The substrate 100 is flexible and may include a plastic material having good heat resistance and durability. For example, the substrate 100 may include at least one of polyethersulfone (PES), polyacrylate (PA), polyether imide (PEI), polyethylene naphthalate (PEN), polyethylene terephthalate (PET), polyphenylene sulfide (PPS), polyarylate (PAR), polyimide (PI), polycarbonate (PC), cellulose triacetate, cellulose acetate propionate (CAP), poly(arylene ether sulfone) and a combination thereof. However, the present disclosure is not limited thereto. The substrate 100 may include, e.g., metals, glass, or the like.

The display unit 200 may be, e.g., only, in the first area 1A of the substrate 100. The display unit 200 may include pixels and at least one thin film transistor (TFT) electrically connected to each pixel. Each pixel may include a light-emitting device, and the display apparatus according to the present embodiment may include organic light-emitting diodes (OLEDs). However, the present disclosure is not limited thereto. The display apparatus may include inorganic light-emitting devices, e.g., liquid crystal devices or light-emitting diodes (LEDs).

The encapsulation unit 300 may be on the display unit 200 to cover the same. The encapsulation unit 300 may include a first inorganic layer 310, a second inorganic layer 330, and an organic layer 320 therebetween. The encapsulation unit 300 may be in the first area 1A and in the second area 2A. For example, as illustrated in FIG. 2, the encapsulation unit 300 may be conformal on the top and side surfaces of the display unit 200, and may extend beyond the display unit 200 in the second area 2A. Further, as shown in FIG. 2, the first inorganic layer 310, the second inorganic layer 330, and the organic layer 320 may be in the first area 1A and the second area 2A, and, e.g., only, the first inorganic layer 310 and the second inorganic layer 330 may extend into the third area 3A.

As described above, the organic layer 320 may not be in the third area 3A and may be, e.g., only, in the first area 1A and in the second area 2A. In the present embodiment, the organic layer 320 may include organic patterns 320a in the second area 2A of the substrate 100 at certain intervals. For example, as illustrated in FIG. 2, the organic layer 320 may extend continuously in the entire first area A1, and may include only discrete portions completely separated and spaced apart from each other in the second area 2A. A shape of the organic pattern 320a is not limited to a certain shape, and the organic patterns 320a having, e.g., polygonal, circular, and oval shapes, may be repeatedly arranged. The organic patterns 320a may be on the first inorganic layer 310, and the second inorganic layer 330 may cover, e.g., conformally, the organic patterns 320a, as will be described in more detail below with reference to FIG. 3.

Figure 3:
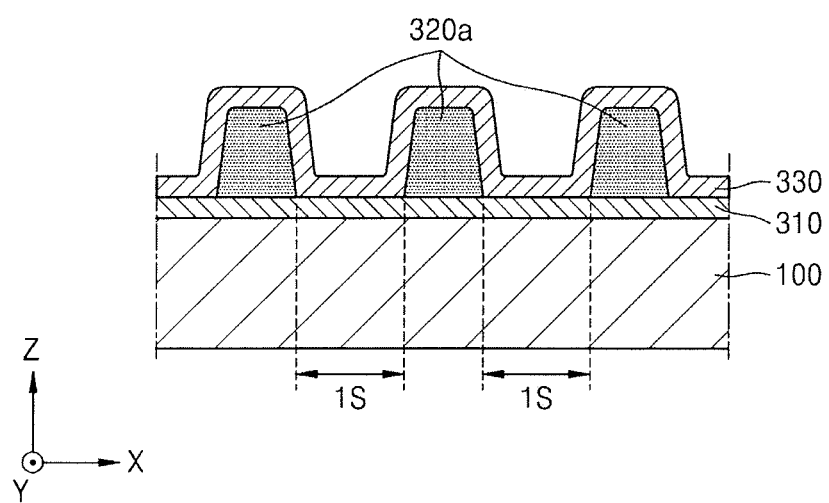
FIG. 3 illustrates a cross-sectional view of an enlarged portion of FIG. 2.

FIG. 3 is a partial, enlarged cross-sectional view of the second area A2 of FIG. 2. Hereinafter, the encapsulation unit 300 will be described in detail with reference to FIGS. 2 and 3.

For convenience, FIG. 3 shows the first inorganic layer 310 directly on the substrate 100, the organic layer 320 on the first inorganic layer 310, and the second inorganic layer 330 covering the organic layer 320. However, the present disclosure is not limited thereto. For example, the first inorganic layer 310 may not be directly on the substrate 100, and a buffer layer 110 (of FIG. 4), a barrier layer and/or the like may be on the substrate 100, and the encapsulation unit 300 including the first inorganic layer 310 may be on the buffer layer 110, the barrier layer, and/or the like.

Referring to FIGS. 2 and 3, the encapsulation unit 300 included in the display apparatus according to the present embodiment may cover the display unit 200 and may include the first inorganic layer 310, the second inorganic layer 330, and the organic layer 320 between the first inorganic layer 310 and the second inorganic layer 330. The organic layer 320 may extend from the first area 1A to the second area 2A, and the organic layer 320 in the second area 2A may include the organic patterns 320a, as shown in FIG. 3.

In detail, the organic patterns 320a may be arranged at certain intervals, and first spaced regions 1S may exist between the organic patterns 320a. In this case, the first spaced regions 1S may be gaps between the organic patterns 320a, e.g., each first spaced region 1S may be a gap between every two organic patterns 320a adjacent to each other along the x-axis, and widths of the first spaced regions 1S may be uniform or non-uniform according to shapes of the organic patterns 320a. For example, when the organic patterns 320a have polygonal shapes formed of straight lines, the widths of the first spaced regions 1S may be substantially uniform. In another example, when the organic patterns 320a have curved shapes, the widths of the first spaced regions 1S may not be uniform. Therefore, as shown in FIG. 3, all of the first spaced regions 1S may have uniform widths. However, in other embodiments, the first spaced regions 1S may have non-uniform widths.

In the present embodiment, the first inorganic layer 310 and the second inorganic layer 330 may directly contact each other in the first spaced regions 1S. For example, as illustrated in FIG. 3, the second inorganic layer 330 may conformally cover the organic patterns 320a, e.g., completely cover all exposed surfaces of the organic patterns 320a and extend directly on the first inorganic layer 310 between adjacent organic patterns 320a. Since the organic layer 320 of the encapsulation unit 300 is not disposed in the first spaced regions 1S, at least a portion of the first inorganic layer 310 is exposed to the outside in the first spaced regions 1S, and through the exposed portion of the first inorganic layer 310, the first inorganic layer 310 and the second inorganic layer 330 may directly surface-contact each other in the first spaced regions 1S.

According to embodiments, as the organic layer 320 of the encapsulation unit 300 includes organic patterns 320a that are spaced apart from each other in the bending area of the display apparatus, i.e., in the second area A2, stress generated while the organic layer 320 is bent in the bending area may decrease. Further, if the encapsulation unit 300 cracks in the bending area, i.e., in the second area A2, moisture from the organic patterns 320a may be blocked from penetrating into the display unit 200 due to the separate organic patterns 320a and the first and second inorganic layers 310 and 330 therebetween.

Figure 4:
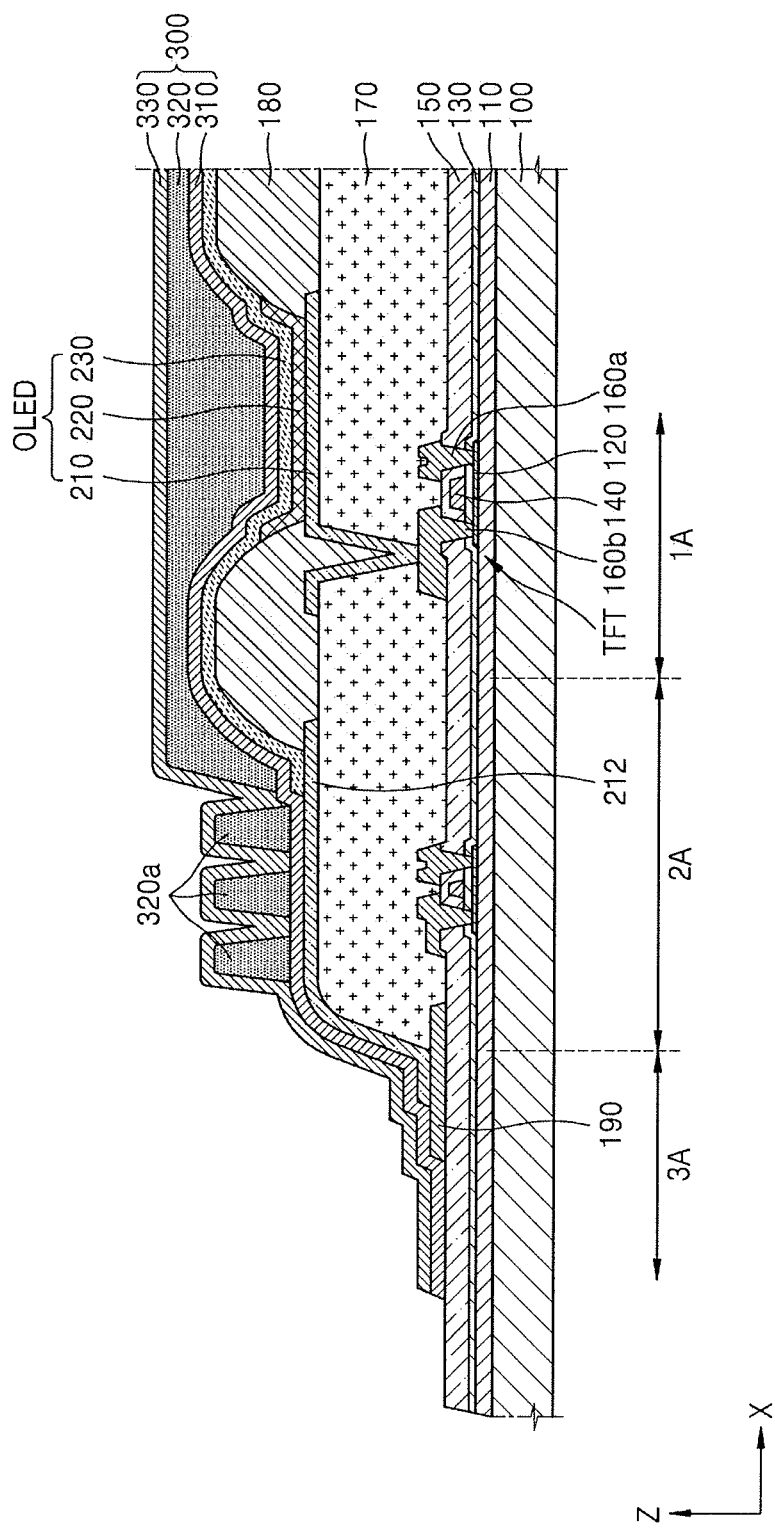
FIG. 4 illustrates a cross-sectional view of an enlarged portion of FIG. 2 according to another embodiment.

FIG. 4 is a cross-sectional view of another enlarged cross-section of FIG. 2. Hereinafter, the display unit 200 and the encapsulation unit 300 will be described in detail with reference to FIG. 4.

Referring to FIG. 4, with regard to the display unit 200 in the first area 1A, the buffer layer 110 may be disposed on the substrate 100 to flatten a surface of the substrate 100 or prevent impurities from penetrating a semiconductor layer 120 of the TFT. The buffer layer 110 may include, e.g., silicon oxide, silicon nitride, or the like. The semiconductor layer 120 may be on the buffer layer 110.

A gate electrode 140 is on the semiconductor layer 120, and according to signals transmitted to the gate electrode 140, a source electrode 160a is electrically connected to a drain electrode 160b. The gate electrode 140 may be a layer or layers including, e.g., at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), by taking into account adhesion to a neighboring layer, surface flatness of stacked layers, workability, etc.

In this case, in order to insulate the semiconductor layer 120 and the gate electrode 140 from each other, a first inorganic insulating layer 130 may be between the semiconductor layer 120 and the gate electrode 140. The first inorganic insulating layer 130 may include, e.g., silicon oxide, silicon nitride, and/or the like. The first inorganic insulating layer 130 may be a gate insulating layer.

A second inorganic insulating layer 150 may be on the gate electrode 140 and may be a layer or layers including, e.g., silicon oxide, silicon nitride, or the like. The second inorganic insulating layer 150 may be an interlayer insulating layer.

The source electrode 160a and the drain electrode 160b may be on the second inorganic insulating layer 150. The source electrode 160a and the drain electrode 160b are respectively electrically connected to the semiconductor layer 120 through contact holes in the first inorganic insulating layer 130 and the second inorganic insulating layer 150. The source electrode 160a and the drain electrode 160b may each be a layer or layers including, e.g., at least one of Al, Pt, Pd, Ag, Mg, Au, Ni, Nd, Ir, Cr, Li, Ca, Mo, Ti, W, and Cu, by taking conductivity, etc. into account.

A protection layer may be on the TFT to cover and protect the same. The protection layer may include an inorganic material, e.g., silicon oxide, silicon nitride, or silicon oxynitride.

An insulating layer 170 may be above the substrate 100. In this case, the insulating layer 170 may be a planarization layer or a protection layer. The insulating layer 170 may substantially flatten an upper surface of the TFT and may protect the TFT and various devices when an OLED is above the TFT. The insulating layer 170 may include, e.g., an acryl-based organic material, benzocyclobutene (BCB), or the like. In this case, as shown in FIG. 4, the buffer layer 110, the first inorganic insulating layer 130, the second inorganic insulating layer 150, and the insulating layer 170 may be over the entire substrate 100.

A pixel-defining layer 180 may be above the TFT. The pixel-defining layer 180 may be on the insulating layer 170 and may have an opening. The pixel-defining layer 180 may define a pixel area of the substrate 100.

The pixel-defining layer 180 may be, e.g., an organic insulating layer. The organic insulating layer may include an acryl-based polymer, e.g., poly(methyl methacrylate) (PMMA), polystyrene (PS), a polymer derivative having a phenol group, an imide-based polymer, an aryl ether-based polymer, an amide-based polymer, a fluorine-based polymer, a p-xylene-based polymer, a vinyl alcohol-based polymer, and a combination thereof.

The OLED may be on the insulating layer 170. The OLED may include a pixel electrode 210, an intermediate layer 220 including an emission layer (EML), and an opposite electrode 230.

The pixel electrode 210 may be a (translucent) transparent electrode or a reflective electrode. When the pixel electrode 210 is a (translucent) transparent electrode, the pixel electrode 210 may include, e.g., indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may include, e.g., a reflection layer including Ag, Mg, Al, Pt, Pd, Au, Ni, Nd, Ir, Cr, and a combination thereof and a layer including ITO, IZO, ZnO, $In_2O_3$, IGO, or AZO. However, the present disclosure is not limited thereto. The pixel electrode 120 may include various materials and may have various structures, e.g., a single-layer structure, a multilayer structure, or the like.

The intermediate layer 220 may be respectively disposed in the pixel area defined by the pixel-defining layer 180. The intermediate layer 220 may include the EML that emits light according to electrical signals and may have a single-layer structure or a multilayer structure in which a hole injection layer (HIL) and a hole transport layer (HTL) between the EML and the pixel electrode 210, an electron transport layer (ETL) and an electron injection layer (EIL) between the EML and the opposite electrode 230, etc. are stacked in addition to the EML. However, the intermediate layer 220 is not limited thereto and may have various structures. The intermediate layer 220 may include a low-molecular weight organic material or a polymer organic material.

When the intermediate layer 220 includes a low-molecular weight organic material, the intermediate layer 220 may have a structure in which an HTL, an HIL, an ETL, an EIL, and the like are stacked with respect to the EML. In addition to the aforementioned layers, various layers may be additionally stacked according to necessity. In this case, the intermediate layer 220 may include various organic materials, e.g., copper phthalocyanine (CuPc), N-Di(naphthalene-1-yl)-N, N'-diphenyl-benzidine (NPB), and tris-8-hydroxyquinoline aluminum (Alq3).

When the intermediate layer 220 includes a polymer organic material, the HTL may be additionally included. The HTL may include poly-(2,4)-ethylene-dihydroxy thiophene (PEDOT), polyaniline (PANI), or the like. In this case, the polymer organic material may be a poly-phenylenevinylene (PPV)-based polymer organic material, a polyfluorene-based polymer organic material, or the like. Also, inorganic materials may be further included between the intermediate layer 220, the pixel electrode 210, and the opposite electrode 230.

In this case, the HTL, the HIL, the ETL, and the EIL may be integrally formed on the entire substrate 100, and the EML may be only formed on each pixel by an inkjet printing process.

The opposite electrode 230 covering the intermediate layer 220, which includes the EML, and facing the pixel electrode 210 may be over the entire substrate 100. The opposite electrode 230 may be a (translucent) transparent electrode or a reflective electrode.

When the opposite electrode 230 is a (translucent) transparent electrode, the opposite electrode 230 may include a layer including a metal having a small work function, e.g., Li, Ca, lithium fluoride (LiF)/Ca, LiF/Al, Al, Ag, Mg, and/or a combination thereof, and a (translucent) transparent layer including, e.g., ITO, IZO, ZnO, or $In_2O_3$, and/or the like. When the opposite electrode 230 is a reflective electrode, the opposite electrode 230 may include a layer including, e.g., Li, Ca, LiF/Ca, LiF/Al, Al, Ag, Mg, and/or a combination thereof. However, the structure and materials of the opposite electrode 230 are not limited thereto and may vary.

The encapsulation unit 300 may be on the opposite electrode 230. Although FIG. 4 shows that the first inorganic layer 310 of the encapsulation unit 300 is directly on the opposite electrode 230, the present disclosure is not limited thereto. In another embodiment, a polarization layer, a functional layer including an inorganic material, or the like may be further disposed between the opposite electrode 230 and the first inorganic layer 310.

The encapsulation unit 300 may include the first inorganic layer 310, the second inorganic layer 330, and the organic layer 320 between the first inorganic layer 310 and the second inorganic layer 330. The encapsulation unit 300 may cover various insulating layers included in the display unit 200 and the OLED and thus may prevent impurities such as external moisture or oxygen from penetrating the display unit 200.

The organic layer 320 of the encapsulation unit 300 may include at least one of, e.g., acryl-based resin, metacryl-based resin, polyisoprene, vinyl-based resin, epoxy-based resin, urethane-based resin, cellulose-based resin, and perylene-based resin. Also, the first inorganic layer 310 and the second inorganic layer 330 of the encapsulation unit 300 may include, e.g., at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. In this case, the first inorganic layer 310 and the second inorganic layer 330 may include the same material or different materials.

The first inorganic layer 310 and the second inorganic layer 330 according to the present embodiment may be over the entire substrate 100 throughout the first area 1A, the second area 2A, and the third area 3A. On the other hand, the organic layer 320 may be in the first area 1A and the second area 2A, but may not be in the third area 3A. Therefore, in the first area 1A and the second area 2A, the organic layer 320 is between the first inorganic layer 310 and the second inorganic layer 330, but in the third area 3A, the first inorganic layer 310 and the second inorganic layer 330 may directly surface-contact each other. In at least a portion of the second area 2A, the first inorganic layer 310 and the second inorganic layer 330 may directly contact each other.

The organic layer 320 may include the organic patterns 320a in the second area 2A. The organic patterns 320a may be spaced apart from each other at certain intervals with the first spaced regions 1S therebetween. As shown in FIG. 4, the organic patterns 320a may be above the insulating layer 170. That is, the insulating layer 170 may extend from the first area 1A towards the second area 2A, and the organic patterns 320a may be above the insulating layer 170 in the second area 2A. Referring to FIG. 4, a wire layer 212 may be further disposed between the organic patterns 320a and the insulating layer 170, in addition to the first inorganic layer 310. However, the present disclosure is not limited thereto. Also, shapes or the number of organic patterns 320a above the insulating layer 170 are not limited to the illustration of FIG. 4 and may vary according to embodiments.

In the third area 3A, the buffer layer 110, the first inorganic insulating layer 130, and the inorganic insulating layer 150 may be disposed. That is, the buffer layer 110, the first inorganic insulating layer 130, and the inorganic insulating layer 150 may be over the entire substrate 100, i.e., in the first area 1A, the second area 2A, and the third area 3A. The first inorganic layer 310 and the second inorganic layer 330 may extend to cover at least a portion of the third area 3A and may surface-contact each other in the third area 3A as described above.

A metal layer 190 may be on the second inorganic insulating layer 150. The metal layer 190 may be an electrode power supply line. As shown in FIG. 4, the metal layer 190 may be in the third area 3A and the second area 2A, but the present embodiment is not limited thereto. At least a portion of the metal layer 190 may be covered by the insulating layer 170. Exposed portions of the metal layer 190, which are not covered by the insulating layer 170, may contact the wire layer 212 and thus may provide power to the display apparatus.

In a bending area of the display apparatus according to the present embodiment, the organic layer 320 of the encapsulation unit 300 having a structure, in which the first inorganic layer 310, the organic layer 320, and the second inorganic layer 330 are sequentially stacked, may include the organic patterns 320a. Accordingly, when the encapsulation unit 300 cracks in the bending area, the display apparatus according to the present embodiment may block a path through which moisture penetrates from the organic layer 320 and thus may effectively prevent the moisture from penetrating the display unit 200. In addition, the organic layer 320 of the encapsulation unit 300 includes the organic patterns 320a, and thus stress generated while the organic layer 320 is bent may decrease.

Figure 5:
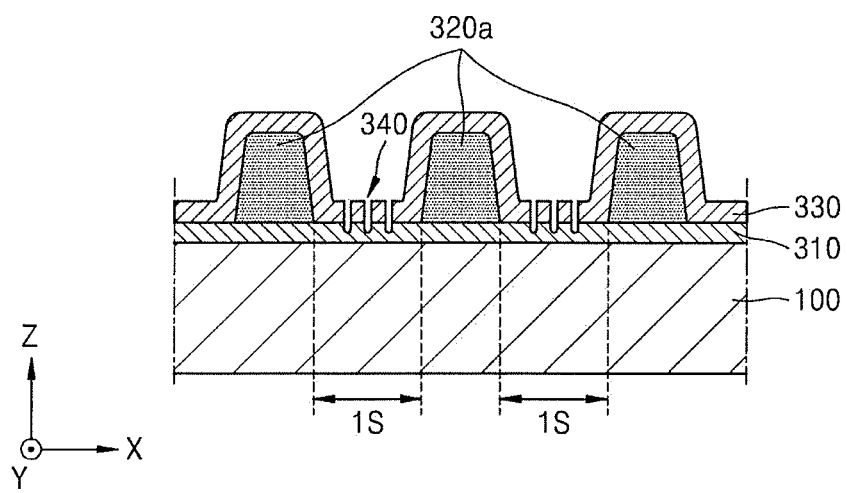
FIG. 5 illustrates a cross-sectional view of a display apparatus according to another embodiment.

FIG. 5 is a cross-sectional view of a display apparatus according to another embodiment.

FIG. 5 shows the organic patterns 320a in the second area 2A, according to another embodiment. Also, FIG. 5 shows that the first inorganic layer 310 is directly on the substrate 100 as shown in FIG. 3, but as shown in FIG. 4, the buffer layer 110, the first inorganic insulating layer 130, the second inorganic insulating layer 150, and the insulating layer 170 may be above the substrate 100, and the first inorganic layer 310 may be above the insulating layer 170.

Referring to FIG. 5, the encapsulation unit 300 may include the first inorganic layer 310, the second inorganic layer 330, and the organic layer 320 therebetween. In this case, the organic layer 320 in the second area 2A may include the organic patterns 320a, and the organic patterns 320a may be spaced apart from each other at certain intervals with the first spaced regions 1S therebetween. Since the organic layer 320 is not disposed in the first spaced regions 1S, the first inorganic layer 310 may directly contact the second inorganic layer 330.

In the display apparatus according to the present embodiment, the first inorganic layer 310 and the second inorganic layer 330 may include first trenches 340 in the first spaced regions 1S, e.g., each of the first spaced regions 1S may include a plurality of first trenches 340 spaced apart from each other along the x-axis direction. The first trenches 340 penetrate the second inorganic layer 330, e.g., along the z-axis direction, but may not completely penetrate the first inorganic layer 310. Since the first inorganic layer 310 and the second inorganic layer 330 of the encapsulation unit 300 prevent penetration of external moisture, the first trenches 340 should not penetrate the first inorganic layer 310.

Referring to the structure in FIG. 5, the first trenches 340 are respectively formed as grooves. The first trenches 340 may extend in a first direction, e.g., in the y-axis direction, along a bending axis BAX (refer to FIG. 6) on a plane.

As the first trenches 340 extend along the bending axis BAX, e.g., along an entire length of the substrate 100 in the y-axis direction, the first inorganic layer 310 and the second inorganic layer 330 may not crack in the bending area, thereby improving flexibility of the display apparatus. In the display apparatus according to the present embodiment, as the first trenches 340 are formed in the first inorganic layer 310 and the second inorganic layer 330 disposed in the first spaced regions 1S, cracks, layer lifting, or the like occurring on an outer region of a panel may be prevented.

Figure 6:
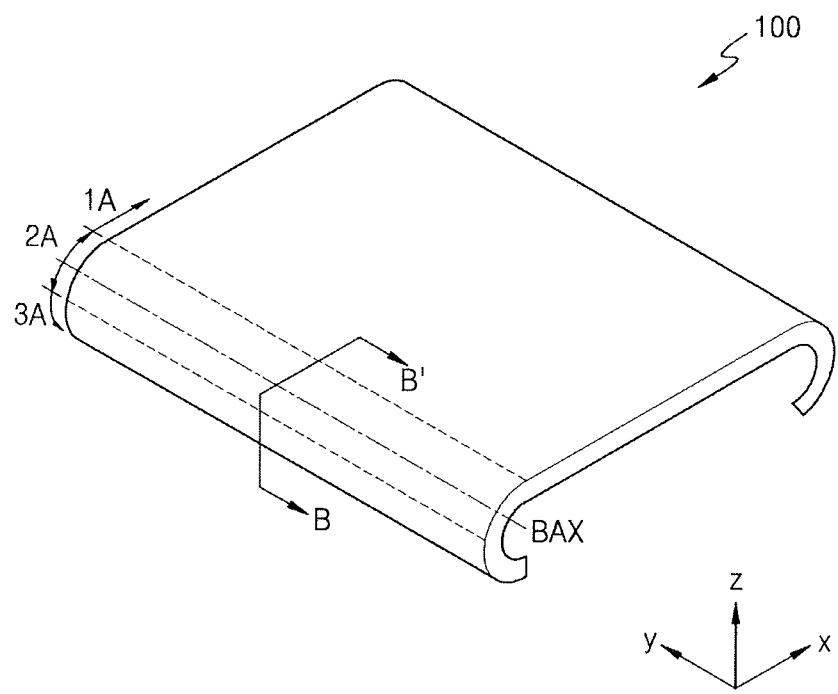
FIG. 6 illustrates a plan view of a display apparatus according to another embodiment.
Figure 7:
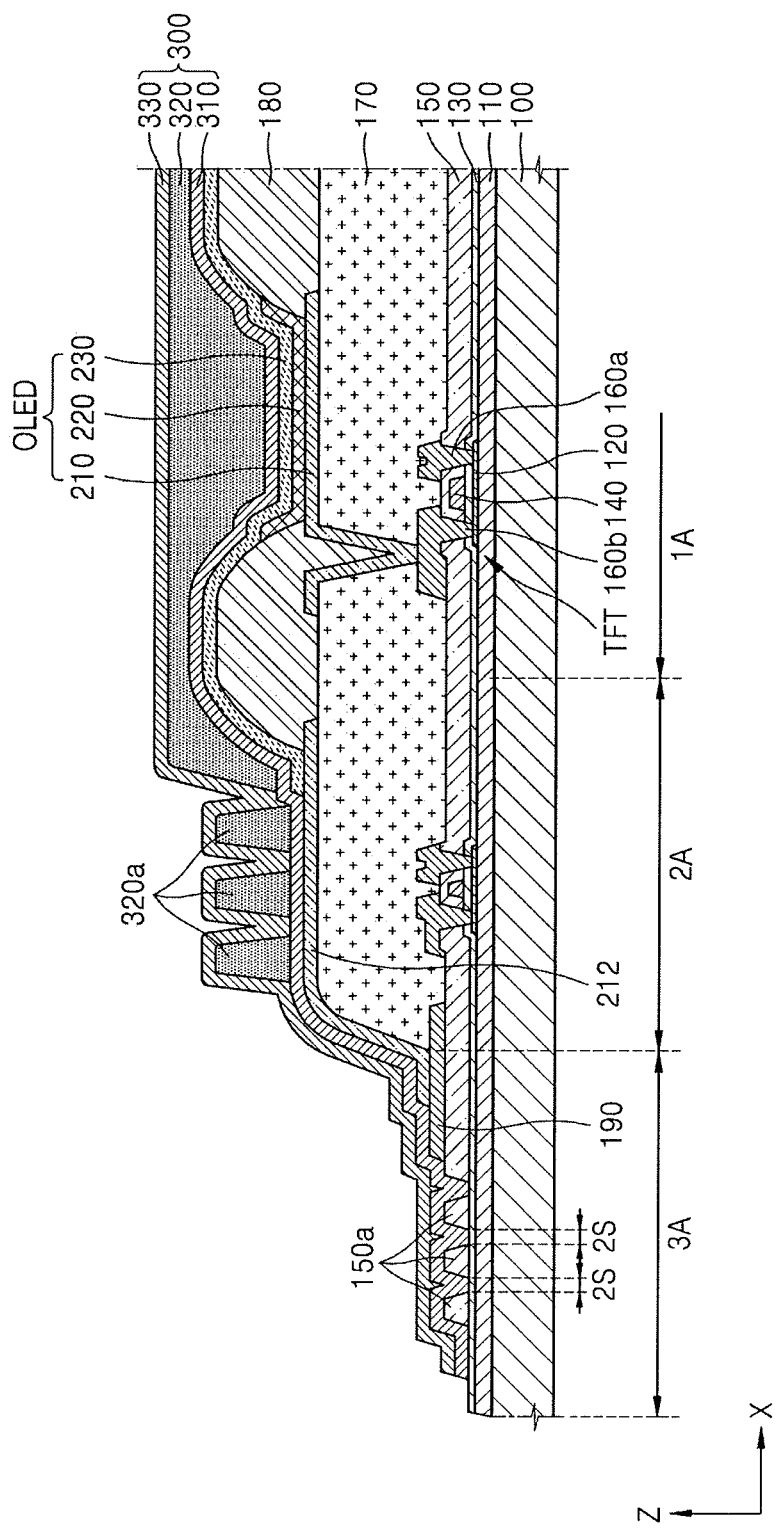
FIG. 7 illustrates a cross-sectional view along line B-B' of FIG. 6.

FIG. 6 is a plan view of a display apparatus according to another embodiment. FIG. 7 is a cross-sectional view taken along line B-B' of the display apparatus of FIG. 6.

As shown in FIG. 6, a portion of the substrate 100 of the display apparatus according to the present embodiment is bent, and thus a portion of the display apparatus is also bent along the bent portion of the substrate 100. However, for convenience, FIG. 7 shows that the display apparatus is not bent. For reference, in cross-sectional views, plan views, or other drawings regarding embodiments to be described later, the display apparatus is not bent.

The substrate 100 of the display apparatus according to the present embodiment may include the first area 1A, the third area 3A, and the second area 2A between the first area 1A and the third area 3A. In this case, the second area 2A and the third area 3A are bending areas, and the first area 1A, the second area 2A, and the third area 3A may be disposed on different planes.

As shown in FIG. 7, the structure of the display unit 200 in the first area 1A is the same as described with reference to FIG. 4, and thus repeated descriptions are omitted.

Referring to FIGS. 6 and 7, the first inorganic layer 310 and the second inorganic layer 330 according to the present embodiment may be over the entire substrate 100 throughout the first area 1A, the second area 2A, and the third area 3A. On the other hand, the organic layer 320 may be only in the first area 1A and the second area 2A, but may not be in the third area 3A. Therefore, in the first area 1A and the second area 2A, the organic layer 320 is between the first inorganic layer 310 and the second inorganic layer 330, but in the third area 3A, the first inorganic layer 310 and the second inorganic layer 330 may directly surface-contact each other. In at least a portion of the second area 2A, the first inorganic layer 310 and the second inorganic layer 330 may directly contact each other.

The organic layer 320 in the second area 2A may include the organic patterns 320a. The organic patterns 320a may be spaced apart from each other at certain intervals with the first spaced regions 1S therebetween. As shown in FIG. 7, the organic patterns 320a may be above the insulating layer 170. That is, the insulating layer 170 may extend from the first area 1A to the second area 2A, and above the insulating layer 170 in the second area 2A, the organic patterns 320a may be disposed.

In the third area 3A, the first inorganic insulating layer 130 and the second inorganic insulating layer 150 may be disposed in addition to the buffer layer 110. That is, the buffer layer 110, the first inorganic insulating layer 130, and the second inorganic insulating layer 150 may be over the entire substrate 100, i.e., in the first area 1A, the second area 2A, and the third area 3A. The first inorganic layer 310 and the second inorganic layer 330 may extend to cover at least a portion of the third area 3A. The first inorganic layer 310 and the second inorganic layer 330 may surface-contact each other, as shown in FIG. 3.

In the third area 3A, the second inorganic insulating layer 150 may include inorganic patterns 150a that are spaced apart from each other with second spaced regions 2S therebetween. Shapes or the number of the inorganic patterns 150a are not limited thereto. Since the second inorganic insulating layer 150 is not disposed in the second spaced regions 2S, at least a portion of the first inorganic insulating layer 130 may be exposed in the second spaced regions 2S. Referring to FIG. 7, the first inorganic layer 310 and the second inorganic layer 330 extend on the inorganic patterns 150a, and into the second spaced regions 2S. Thus, at least a portion of the first inorganic insulating layer 130 may directly contact the first inorganic layer 310 of the encapsulation unit 300 through the second spaced regions 2S.

FIG. 7 shows that the at least a portion of the first inorganic insulating layer 130 contacts the first inorganic layer 310 in the second spaced regions 2S. However, the present disclosure is not limited thereto.

Figure 8:
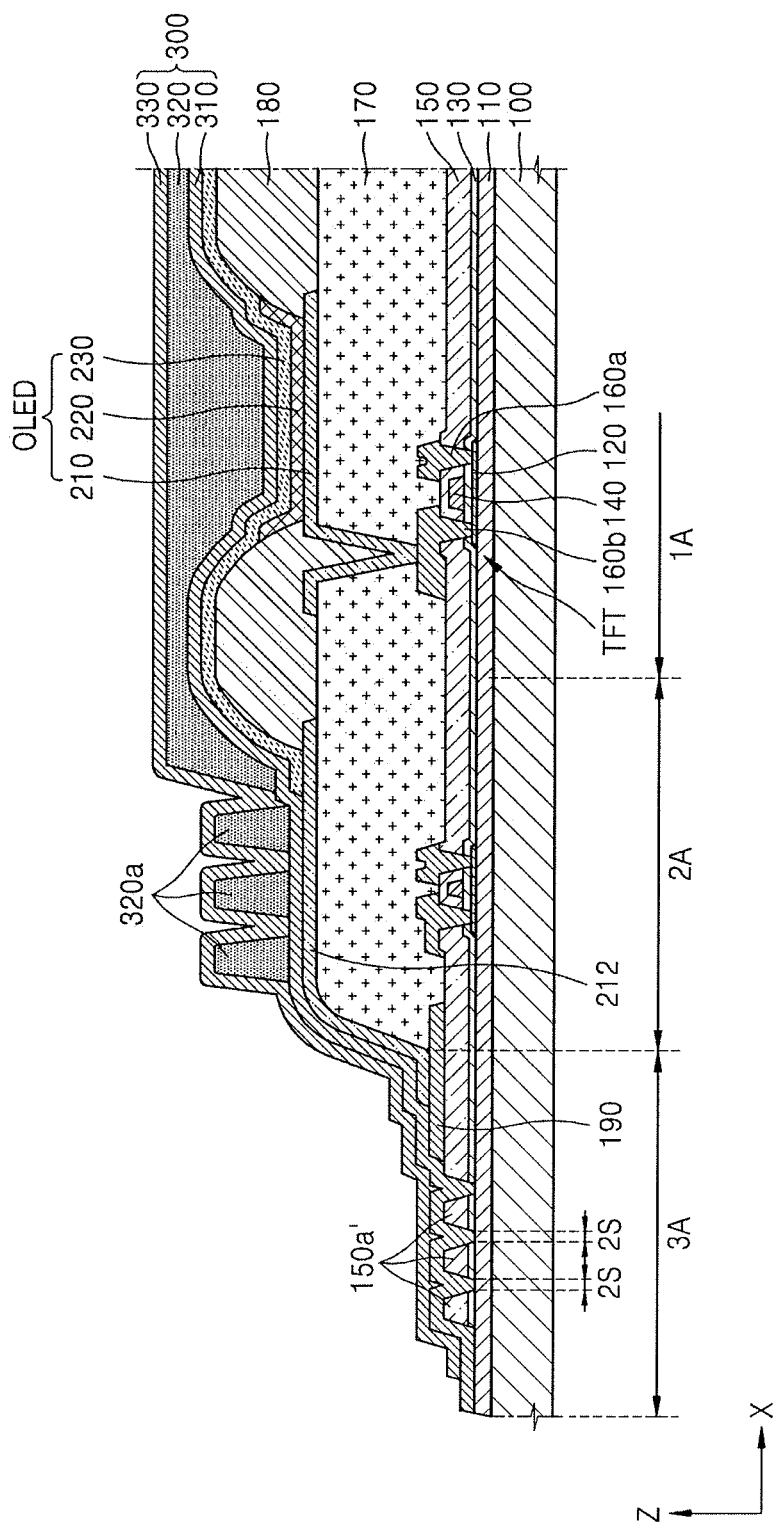
FIG. 8 illustrates a cross-sectional view of a display apparatus according to another embodiment.

In another embodiment, as shown in FIG. 8, in the second spaced regions 2S between inorganic patterns 150a', at least a portion of the buffer layer 110 may contact the first inorganic layer 310. That is, in a bending area of the display apparatus according to the present embodiment, the organic layer 320 of the encapsulation unit 300, which has a structure in which the first inorganic layer 310, the organic layer 320, and the second inorganic layer 330 are sequentially stacked, includes the organic patterns 320a, and the first inorganic insulating layer 130 may include inorganic patterns. When the encapsulation unit 300 or the first inorganic insulating layer 130 cracks in the bending area, the display apparatus according to the present embodiment may block a path through which moisture penetrates from the organic layer 320 and thus may effectively prevent the moisture from penetrating the display unit 200. Also, stress generated when the display apparatus is bent may decrease by forming the organic patterns 320a and the inorganic patterns 150a' in the bending area.

Figure 9:
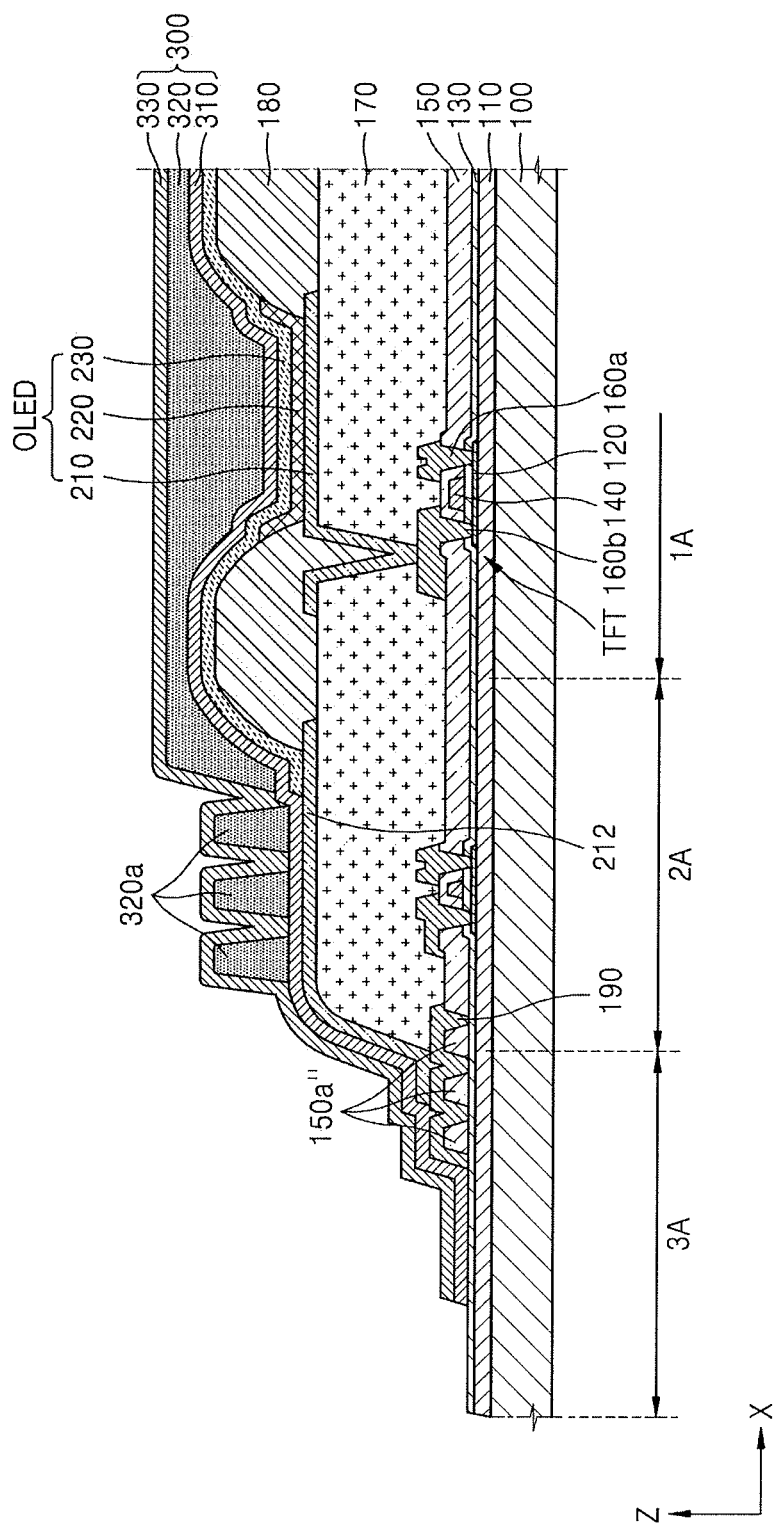
FIG. 9 illustrates a cross-sectional view of a display apparatus according to another embodiment.

FIG. 9 is a cross-sectional view of a display apparatus according to another embodiment.

FIG. 9 shows inorganic patterns 150a" different from those described in the above embodiments. Hereinafter, differences will be mainly described, and repeated descriptions will be omitted.

Referring to FIG. 9, the second inorganic insulating layer 150 according to the present embodiment may include the inorganic patterns 150a". As shown in FIG. 9, the inorganic patterns 150a" may be on the first inorganic insulating layer 130, and according to another embodiment, the inorganic patterns 150a" may be above the buffer layer 110. The inorganic patterns 150a" may be in the third area 3A, and as shown in FIG. 9, the inorganic patterns 150a" may be in a portion of the second area 2A close to the third area 3A.

In the present embodiment, the metal layer 190 may be on the inorganic patterns 150a", e.g., the metal layer 190 may be formed conformably on the inorganic patterns 150a" and in spaces therebetween. The metal layer 190 on the inorganic patterns 150a" may be an electrode power supply line, a wire, or an electrode. At least a portion of an upper surface of the metal layer 190 may contact the wire layer 212, and at least a portion of a lower surface of the metal layer 190 may contact the first inorganic insulating layer 130.

The metal layer 190 may include the same material as a source electrode or a drain electrode of the TFT of the display unit 200. However, the present disclosure is not limited thereto.

As the metal layer 190 is, e.g., conformal, on the inorganic patterns 150a", a cross-sectional area of the metal layer 190 increases. Thus, the metal layer 190 may not crack in the bending area, thereby improving flexibility of the display apparatus.

Figure 10:
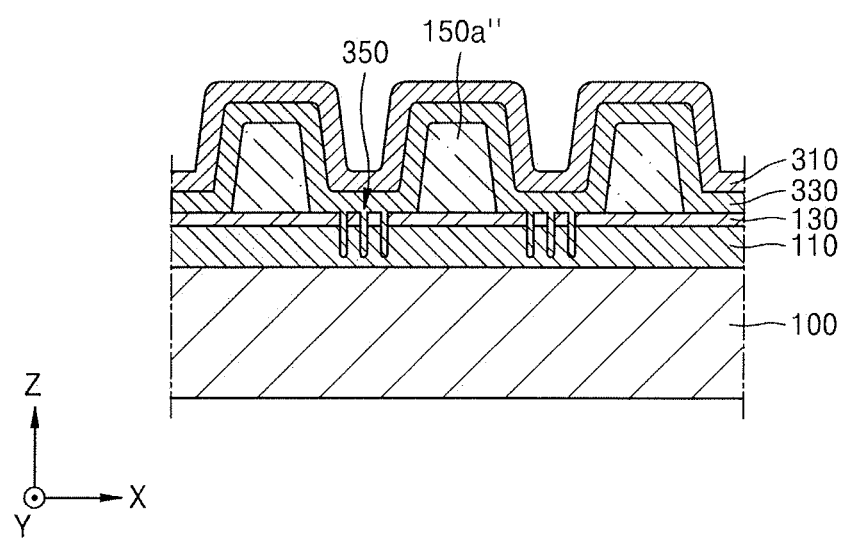
FIG. 10 illustrates a cross-sectional view of a display apparatus according to another embodiment.

FIG. 10 is a cross-sectional view of a display apparatus according to another embodiment.

FIG. 10 shows inorganic patterns 150a" in the third area 3A, according to another embodiment. Referring to FIG. 10, the buffer layer 110 may be on the substrate 100, and a barrier layer may be further disposed on the substrate 100. The first inorganic insulating layer 130 and the second inorganic insulating layer 150 may be on the buffer layer 110, and the second inorganic insulating layer 150 may include the inorganic patterns 150a". As illustrated in FIG. 10, the inorganic patterns 150a" may include the first inorganic insulating layer 130, the second inorganic insulating layer 150, or both the first inorganic insulating layer 130 and the second inorganic insulating layer 150.

In the present embodiment, the second inorganic insulating layer 150 includes the inorganic patterns 150a" that are spaced apart from each other at certain intervals with the second spaced regions 2S therebetween. The first inorganic insulating layer 130 and the buffer layer 110 in the second spaced regions 2S may include second trenches 350. The second trenches 350 may penetrate the first inorganic insulating layer 130, but may not completely penetrate the buffer layer 110. This is to prevent layer lifting between the substrate 100 and the buffer layer 110 and penetration of moisture thereto.

On the inorganic patterns 150a", the first inorganic layer 310 and the second inorganic layer 330 of the encapsulation unit 300 may be disposed. The first inorganic layer 310 and the second inorganic layer 330 of the encapsulation unit 300 may extend to the third area 3A, and thus, may cover the second trenches 350. At least some of the first inorganic layer 310 may be buried in the second trenches 350.

Referring to the structure in FIG. 10, grooves are respectively formed in the second trenches 350, but on a plane, the second trenches 350 may extend in a first direction (a y-axis direction) along the bending axis BAX. As the second trenches 350 extend along the bending axis BAX, the first inorganic insulating layer 130 and the buffer layer 110 may not crack in the bending area, and thus flexibility of the display apparatus may be improved.

With regard to the display apparatus according to the present embodiment, as the second trenches 350 are formed in the first inorganic insulating layer 130 and the buffer layer 110 in the second spaced regions 2S, cracks, layer lifting, or the like occurring on an outer region of a panel may be prevented. Also, in a bending area of the display apparatus according to the present embodiment, the organic layer 320 of the encapsulation unit 300, which has the structure in which the first inorganic layer 310, the organic layer 320, and the second inorganic layer 330 are sequentially stacked, includes the organic patterns 320a, and the first inorganic insulating layer 130 may include the inorganic patterns. Thus, when the first inorganic insulating layer 130 or the encapsulation unit 300 cracks in the bending area, the display apparatus according to the present embodiment may block a path through which moisture penetrates from the organic layer 320 and thus may effectively prevent the moisture from penetrating the display unit 200. Also, stress generated when the display apparatus is bent may decrease by forming the organic patterns 320a and the inorganic patterns 150a''' in the bending area.

By way of summation and review, when a display apparatus is bent during manufacturing, defects, e.g., cracks, may occur in the bending area or the lifetime of the display apparatus may decrease. Therefore, one or more embodiments include a display apparatus having a long lifetime and reduced occurrence of defects, e.g., cracks, during manufacturing.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display apparatus, comprising:
   a substrate including a first area, a second area, and a third area, the first and third areas being bent with respect to each other at a predetermined angle, other than a straight angle, the second area being between the first and third areas, and the second area being bent toward a bottom of the substrate;
   a display unit on a top of the substrate, the display unit being in the first area and including:
   a thin film transistor (TFT),
   an insulating layer covering the TFT and extending from the first area to the second area,
   a pixel defining layer above the TFT, and
   an organic light-emitting diode (OLED) on the insulating layer; and
   an encapsulation layer covering the display unit in the first area and extending into the second area, the encapsulation layer including:
   a first inorganic layer on topmost surfaces of the OLED and the pixel defining layer, the first inorganic layer extending from the first area into the second and third areas,
   a second inorganic layer over the first inorganic layer in the first, second, and third areas,
   an organic layer between the first inorganic layer and the second inorganic layer in the first area and the second area, and
   a plurality of organic patterns included in the organic layer and spaced apart from each other at certain intervals in the second area, the intervals being first spaced regions between the organic patterns in the second area.

2. The display apparatus as claimed in claim 1, wherein the first inorganic layer and the second inorganic layer directly contact each other in the first spaced regions, an entirety of the organic layer being directly between and completely enclosed by the first and second inorganic layers.

3. The display apparatus as claimed in claim 1, wherein the first inorganic layer and the second inorganic layer comprise a plurality of first trenches in the first spaced regions.

4. The display apparatus as claimed in claim 3, wherein the plurality of first trenches penetrate the second inorganic layer.

5. The display apparatus as claimed in claim 4, wherein the plurality of first trenches do not completely penetrate the first inorganic layer.

6. The display apparatus as claimed in claim 3, wherein the plurality of first trenches extend along the bending axis.

7. The display apparatus as claimed in claim 1, wherein the display unit includes:
   a buffer layer between the substrate and the insulating layer;
   a first inorganic insulating layer; and
   a second inorganic insulating layer between the first inorganic insulating layer and the insulating layer,
   wherein the first inorganic insulating layer and the second inorganic insulating layer extend to the third area from the first area via the second area, and
   wherein the second inorganic insulating layer includes, in the third area, a plurality of inorganic patterns that are spaced apart from each other with second spaced regions between the plurality of inorganic patterns.

8. The display apparatus as claimed in claim 7, wherein, in the second spaced regions, at least a portion of the first inorganic insulating layer is exposed.

9. The display apparatus as claimed in claim 7, wherein the first inorganic layer and the second inorganic layer extend to the third area and directly surface-contact each other in the third area.

10. The display apparatus as claimed in claim 9, wherein the first inorganic layer directly contacts the exposed portion of the first inorganic insulating layer in the second spaced regions.

11. The display apparatus as claimed in claim 8, further comprising a metal layer covering the plurality of inorganic patterns.

12. The display apparatus as claimed in claim 11, wherein the metal layer directly contacts the exposed portion of the first inorganic insulating layer in the second spaced regions.

13. The display apparatus as claimed in claim 11, wherein:
    the TFT includes a semiconductor layer, a gate electrode, a source electrode, and a drain electrode,
    the first inorganic insulating layer is between the semiconductor layer and the gate electrode, and
    the second inorganic insulating layer is between the gate electrode and the source electrode or between the gate electrode and the drain electrode.

14. The display apparatus as claimed in claim 13, wherein the metal layer includes a same material as the source electrode or the drain electrode.

15. The display apparatus as claimed in claim 7, wherein the first inorganic insulating layer and the buffer layer in the second spaced regions include a plurality of second trenches.

16. The display apparatus as claimed in claim 15, wherein the plurality of second trenches penetrate the first inorganic insulating layer.

17. The display apparatus as claimed in claim 15, wherein the plurality of second trenches do not completely penetrate the buffer layer.

18. The display apparatus as claimed in claim 15, wherein the third area is a bending area that is bent around the bending axis.

19. The display apparatus as claimed in claim 17, wherein the plurality of second trenches extend along the bending axis.

* * * * *